(12) United States Patent
Chrysler et al.

(10) Patent No.: US 7,964,447 B2
(45) Date of Patent: Jun. 21, 2011

(54) PROCESS OF MAKING CARBON NANOTUBE ARRAY THAT INCLUDES IMPREGNATING THE CARBON NANOTUBE ARRAY WITH METAL

(75) Inventors: Gregory M. Chrysler, Chandler, AZ (US); Thomas S. Dory, Gilbert, AZ (US); James G. Maveety, San Jose, CA (US); Edward Prack, Phoenix, AZ (US); Unnikrishnan Vadakkanmaruveedu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/387,871

(22) Filed: May 8, 2009

(65) Prior Publication Data
US 2009/0218681 A1    Sep. 3, 2009

Related U.S. Application Data

(62) Division of application No. 11/323,205, filed on Dec. 30, 2005, now Pat. No. 7,545,030.

(51) Int. Cl.
*H01L 21/58* (2006.01)

(52) U.S. Cl. ............. 438/109; 438/122; 257/E21.505; 977/847

(58) Field of Classification Search ............... 977/744, 977/748, 846, 847
See application file for complete search history.

(56) References Cited

U.S. PATENT DOCUMENTS

| | | | |
|---|---|---|---|
| 6,129,901 A * | 10/2000 | Moskovits et al. | 423/447.3 |
| 6,469,381 B1 | 10/2002 | Houle et al. | |
| 7,109,581 B2 * | 9/2006 | Dangelo et al. | 257/720 |
| 7,335,408 B2 * | 2/2008 | Kyotani et al. | 428/34.1 |
| 7,335,983 B2 | 2/2008 | Maveety et al. | |
| 7,428,138 B2 | 9/2008 | Mosley et al. | |
| 2004/0150100 A1 | 8/2004 | Dubin et al. | |

* cited by examiner

*Primary Examiner* — Stephen W Smoot
(74) *Attorney, Agent, or Firm* — John N. Greaves

(57) ABSTRACT

A carbon nanotube (CNT) array is patterned on a substrate. The substrate can be a microelectronic die or a heat sink for a die. The patterned CNT array is patterned by using a patterned catalyst on the substrate to form the CNT array by growing. The patterned CNT array can also be patterned by using a patterned mask on the substrate to form the CNT array by growing. A computing system that uses the CNT array for heat transfer from the die is also used.

8 Claims, 9 Drawing Sheets

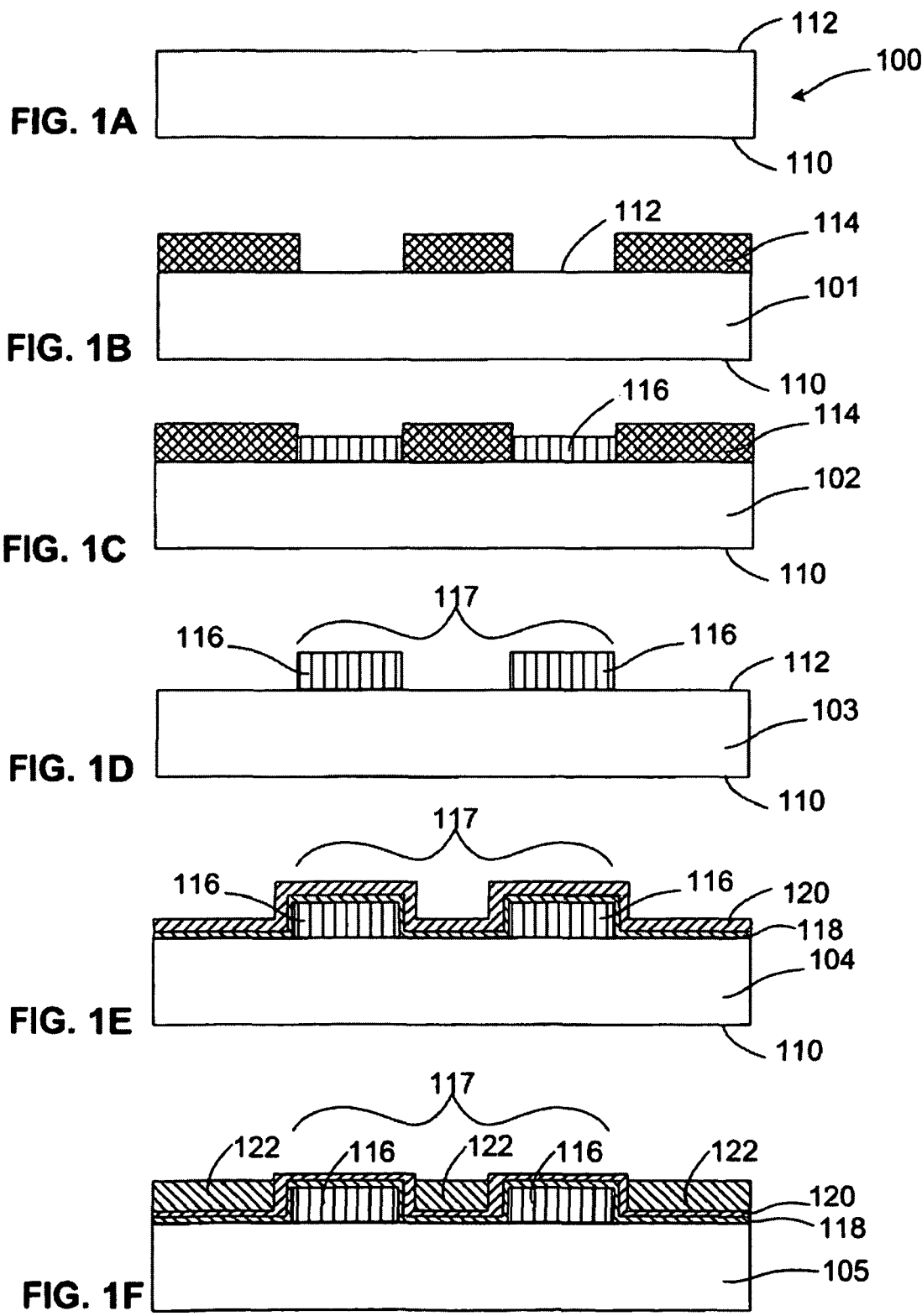

PROCESS OF MAKING CARBON NANOTUBE ARRAY THAT INCLUDES IMPREGNATING THE CARBON NANOTUBE ARRAY WITH METAL

RELATED APPLICATIONS

This is a Divisional of U.S. Pat. No. 7,545,030, which was filed on Dec. 20, 2005 as patent application Ser. No. 11/323, 205.

TECHNICAL FIELD

Embodiments relate generally to heat management in packaged microelectronic devices.

TECHNICAL BACKGROUND

Heat spreaders are used to remove heat from structures such as an integrated circuit (IC). An IC die is often fabricated into a microelectronic device such as a processor. The increasing power consumption of processors results in tighter thermal budgets for a thermal solution design when the processor is employed in the field. Accordingly, a thermal interface solution is often needed to allow the die to reject heat more efficiently.

Various techniques have been employed to transfer heat away from an IC. These techniques include passive and active configurations. One passive configuration involves a conductive material in thermal contact with the backside of a packaged IC die. Because of adhesion and thermal conductivity issues, a polymer-solder hybrid (PSH) has been developed.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. These drawings depict typical embodiments that are not necessarily drawn to scale and are not therefore to be considered to be limiting of its scope. The embodiments will be described and explained with additional specificity and detail through the use of the accompanying drawings in which:

FIG. 1A is a cross-section elevation of a substrate during processing of a carbon nanotube (CNT) array in a metal thermal interface material (TIM) according to an embodiment;

FIG. 1B is a cross-section elevation of the substrate depicted in FIG. 1A of the CNT array in a metal TIM during processing according to an embodiment;

FIG. 1C is a cross-section elevation of the substrate depicted in FIG. 1B of the CNT array in a metal TIM during processing according to an embodiment;

FIG. 1D is a cross-section elevation of the substrate depicted in FIG. 1C of the CNT array in a metal TIM during processing according to an embodiment;

FIG. 1E is a cross-section elevation of the substrate depicted in FIG. 1D of the CNT array in a metal TIM during processing according to an embodiment;

FIG. 1F is a cross-section elevation of the substrate depicted in FIG. 1E of the CNT array in a metal TIM during processing according to an embodiment;

DETAILED DESCRIPTION

Figure 2A:
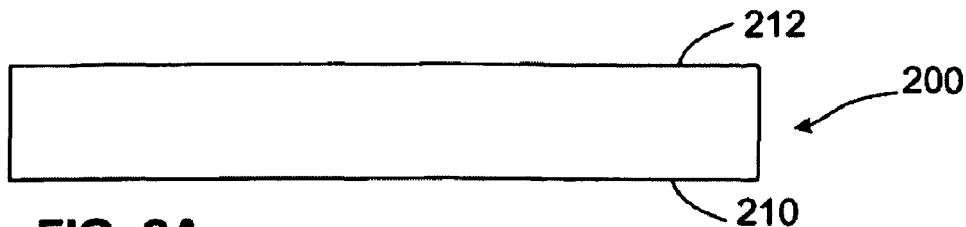
FIG. 2A is a cross-section elevation of a substrate during processing of a CNT array in a metal TIM according to an embodiment.

Heat spreaders are used to remove heat from structures such as an integrated circuit (IC). An IC die is often fabricated into a microelectronic device such as a processor. The increasing power consumption of processors results in tighter thermal budgets for a thermal solution design when the processor is employed in the field. Accordingly, a thermal interface solution is often needed to allow the die to reject heat more efficiently.

Various techniques have been employed to transfer heat away from an IC. These techniques include passive and active configurations. Because adhesion and thermal stresses affect IC die performance, one solution has been to use a polymer-solder hybrid (PSH) to address both adhesion and thermal stress issues.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

FIG. 1A is a cross-section elevation of a substrate 100 during processing of a carbon nanotube (CNT) array in a metal thermal interface material (TIM) according to an embodiment. In an embodiment, the substrate 100 is a semiconductive device such as a processor. In this embodiment, the substrate 100 includes an active surface 110 and a backside surface 112. In an embodiment, the substrate 100 is a heat sink such as an integrated heat spreader (IHS). In this embodiment, the substrate 100 includes a die-side surface 110 and a backside surface 112. In an embodiment, the substrate 100 is a heat sink such as a heat slug. In this embodiment, the substrate 100 includes a die-side surface 110 and a cooling surface 112.

Hereinafter for convenience, the substrate 100 will be described as a processor with an active surface 110 and the backside surface 112. The embodiments of IHS and heat sink can also be substituted as the substrate 100 during the processing as disclosed.

FIG. 1B is a cross-section elevation of the substrate depicted in FIG. 1A of the CNT array in a metal TIM during processing according to an embodiment. During processing, a mask 114 is patterned on the substrate 101 to receive a CNT array. The mask 114 is a material that can be removed after the growth of a CNT array upon the backside surface 112.

In an embodiment where the backside surface 112 of the substrate 101 is conducive to the growth of CNT structures, the mask 114 provides a pattern to grow clusters of the CNT structures. Growth of the CNT structures is carried out under a chemical vapor deposition (CVD) technique according to an embodiment. In an embodiment where the backside surface 112 is silicon, the CVD technique is carried out that is conducive to the nucleation of carbon upon silicon, and thereafter to the cumulative growth of carbon upon deposited carbon. In an embodiment where the backside surface 112 is a metal such as copper that is used for a heat sink, the CVD technique is carried out that is conducive to the nucleation of carbon upon the metal, and thereafter to the cumulative growth of carbon upon deposited carbon.

FIG. 1C is a cross-section elevation of the substrate depicted in FIG. 1B of the CNT array in a metal TIM during processing according to an embodiment. The substrate 102 exhibits a CNT array cluster 116, which is illustrated by vertical cross-hatching to indicate the carbon nanotubes and the orientation thereof with respect to the backside surface 112.

FIG. 1D is a cross-section elevation of the substrate depicted in FIG. 1C of the CNT array in a metal TIM during processing according to an embodiment. The substrate 103 has been stripped of the mask 114 (FIG. 1C) and a CNT array 117, depicted as two CNT array clusters 116, is disposed on the backside surface 112 of the substrate 103. The spaces between the CNT array clusters 116 can be designated as "streets". Depending upon the geometry, a CNT array cluster 116 can have characteristic width, as depicted within the plane of FIG. 1D, in a range from about 10 micrometers (μm) to about 1,000 μm. In an embodiment during CVD growth of the individual carbon nanotubes, a given CNT is grown in a length range from about 1 μm to about 100 μm. The width of a given CNT is in a range from about 15 nm to about 25 nm.

FIG. 1E is a cross-section elevation of the substrate depicted in FIG. 1D of the CNT array in a metal TIM during processing according to an embodiment. The substrate 104 and the two CNT array clusters 116 have been coated with a metallization first film 118. In an embodiment, the metallization first film is formed by chemical vapor deposition (CVD). In an embodiment, the metallization first film is formed by physical vapor deposition (PVD). Accordingly, the CNT array 117 and the substrate 104 are in contact with the metallization first film 118. In an embodiment, the metallization first film 118 is a metal such as titanium or a titanium alloy. In an embodiment, the metallization first film 118 is a metal such as chromium or a chromium alloy. In an embodiment, the metallization first film 118 is a metal or substance that adheres to the substrate 104 and to the CNT structures. The metallization first film 118 can be in a thickness range from about 0.1 microns to about 5 microns.

After processing of the metallization first film 118, a metallization second film 120 is formed according to an embodiment. In an embodiment where the metallization first film 118 is a metal such as titanium, the metallization second film 120 is a flash layer of gold. Accordingly, the metallization first film 118 can be formed by CVD such that coverage of the vertical surfaces of the CNT array clusters 116, of the metallization first film 118, and the metallization second film 120 if present are covered. The metallization second film 120 can be in a thickness range from about 0.5 microns to about 0.1 microns.

FIG. 1F is a cross-section elevation of the substrate depicted in FIG. 1E of the CNT array in a metal TIM during processing according to an embodiment. The substrate 105, the two CNT array clusters 116, the metallization first film 118, and the metallization second film 120 have been impregnated with a TIM metal third film 122. In an embodiment where the metallization first film 118 is an adhesive film such as titanium and where the metallization second film 120 is a more noble metal such as gold, the TIM metal third film 122 is indium or an indium alloy. By "indium alloy" it is understood that the TIM metal third film 122 is at least 50% indium according to an embodiment. In an example embodiment, an indium alloy is a tin-indium alloy with the indium present at least 50% thereof. In an example embodiment, an indium alloy is a silver-tin-indium alloy with indium at least 50% thereof. In an embodiment by "indium alloy", it is understood that the TIM metal third film 122 includes indium as the most prevalent metal. In an example embodiment, an indium alloy is a silver-tin-indium alloy with indium at least 34% thereof but not more than about 49% thereof, and neither the silver nor the tin is present in a greater amount than the indium. In an embodiment, the TIM metal third film 122 is a tin-based solder. In an embodiment, the TIM metal third film 122 is a lead-based solder.

FIG. 2A is a cross-section elevation of a substrate 200 during processing of a CNT array in a metal TIM according to an embodiment. In an embodiment, the substrate 200 is a semiconductive device such as a processor. In this embodiment, the substrate 200 includes an active surface 210 and a backside surface 212. In an embodiment, the substrate 200 is a heat sink such as an IHS. In this embodiment, the substrate 200 includes a die-side surface 210 and a backside surface 212. In an embodiment, the substrate 200 is a heat sink such as a heat slug. In this embodiment, the substrate 200 includes a cooling surface 210 and a die-side surface 212.

Hereinafter for convenience, the substrate 200 will be described as a processor with an active surface 210 and the backside surface 212. The embodiments of IHS and heat sink can also be substituted as the substrate 200 during the processing as disclosed.

Figure 2B:
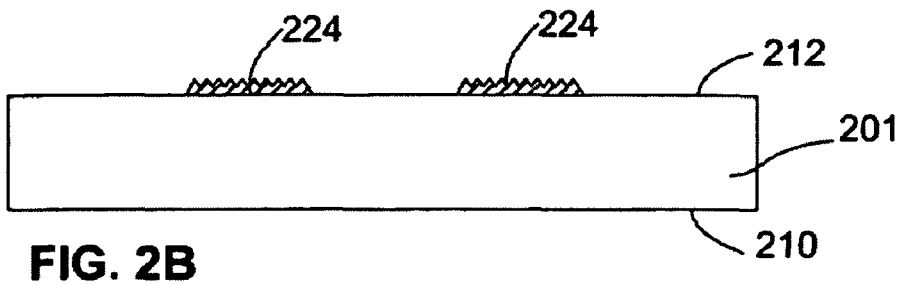
FIG. 2B is a cross-section elevation of the substrate depicted in FIG. 2A of the CNT array in a metal TIM during processing according to an embodiment.

FIG. 2B is a cross-section elevation of the substrate depicted in FIG. 2A of the CNT array in a metal TIM during processing according to an embodiment. During processing, a nucleation film 224 is patterned on the substrate 201 to receive a CNT array. The nucleation film 224 is a material such as a metal that is conducive to the nucleation of a CNT structure. The nucleation film 224 can also be referred to as a catalytic film 224.

In an embodiment, the nucleation film 224 is preferential to allow CNT nucleation thereupon, over the nucleation of the CNT structures upon the backside surface 212 of the substrate 201. In an embodiment where the substrate 201 is a semiconductor material, the nucleation film 224 is a metal such as nickel or a nickel alloy. In an embodiment where the substrate 201 is a semiconductor material, the nucleation film 224 can be a metal such as iron or an iron alloy. In an embodiment where the substrate 201 is a semiconductive material, the nucleation film 224 can be a metal such as titanium or a titanium alloy.

Figure 2C:
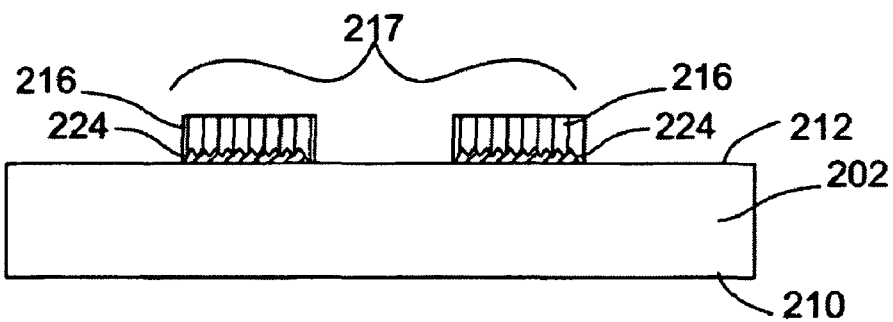
FIG. 2C is a cross-section elevation of the substrate depicted in FIG. 2B of the CNT array in a metal TIM during processing according to an embodiment.

FIG. 2C is a cross-section elevation of the substrate depicted in FIG. 2B of the CNT array in a metal TIM during processing according to an embodiment. The substrate 202 exhibits a CNT array cluster 216, which is illustrated by vertical cross-hatching to indicate the carbon nanotubes and the orientation thereof with respect to the nucleation film 224 and to the backside surface 212. As illustrated, two occurrences of array clusters 216 form a CNT array 217.

Figure 2D:
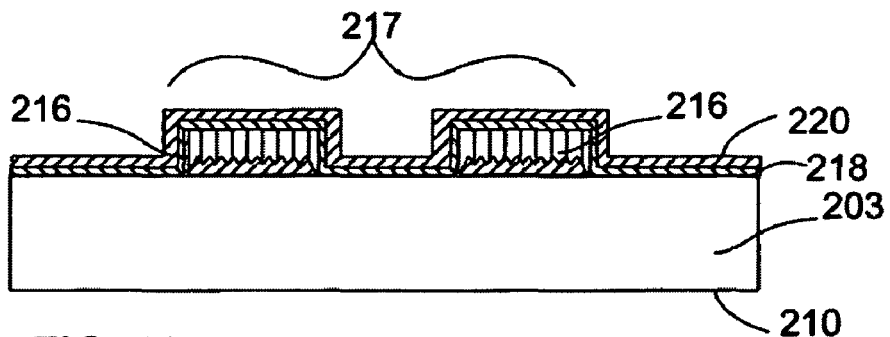
FIG. 2D is a cross-section elevation of the substrate depicted in FIG. 2C of the CNT array in a metal TIM during processing according to an embodiment.

FIG. 2D is a cross-section elevation of the substrate depicted in FIG. 2C of the CNT array in a metal TIM during processing according to an embodiment. The substrate 203 has been overcoated with a metallization first film 218. Accordingly, the CNT array 217 and the substrate 203 are in contact with the metallization first film 218. In an embodiment, the metallization first film 218 is a metal such as titanium or a titanium alloy. In an embodiment, the metallization first film 218 is a metal such as chromium or a chromium alloy. In an embodiment, the metallization first film 218 is a metal or substance that adheres to the substrate 203 and to the CNT structures.

After processing of the metallization first film 218, a metallization second film 220 is formed according to an embodiment. In an embodiment where the metallization first film 218 is a metal such as titanium, the metallization second film 220 is a flash layer of gold. Accordingly, the metallization first film 218 can be formed by CVD such that coverage of the vertical surfaces of the CNT array clusters 216 are coated, followed by an electroless or an electroplating of a flash layer of the metallization second film 220.

Figure 2E:
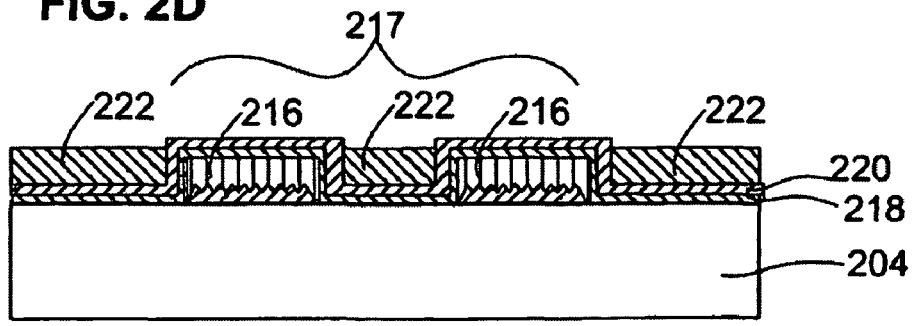
FIG. 2E is a cross-section elevation of the substrate depicted in FIG. 1D of the CNT array in a metal TIM during processing according to an embodiment.

FIG. 2E is a cross-section elevation of the substrate depicted in FIG. 2D of the CNT array in a metal TIM during processing according to an embodiment. The substrate 204, the two CNT array clusters 216, the metallization first film 218, and the metallization second film 220 have been and impregnated with a TIM metal third film 222. In an embodiment where the metallization first film 218 is an adhesive film such as titanium and the metallization second film 220 is a more noble metal such as gold, the TIM metal third film 222 is indium or an indium alloy. By "indium alloy" it is understood that the TIM metal third film 222 is at least 50% indium according to an embodiment. In an example embodiment, an indium alloy is a tin-indium alloy with the indium present at least 50% thereof. In an example embodiment, an indium alloy is a silver-tin-indium alloy with indium at least 50% thereof. In an embodiment by "indium alloy", it is understood that the TIM metal third film 222 includes indium as the most prevalent metal. In an example embodiment, an indium alloy is a silver-tin-indium alloy with indium at least 34% thereof but not more than about 49% thereof, and neither the silver nor the tin is present in a greater amount than the indium.

Figure 3:
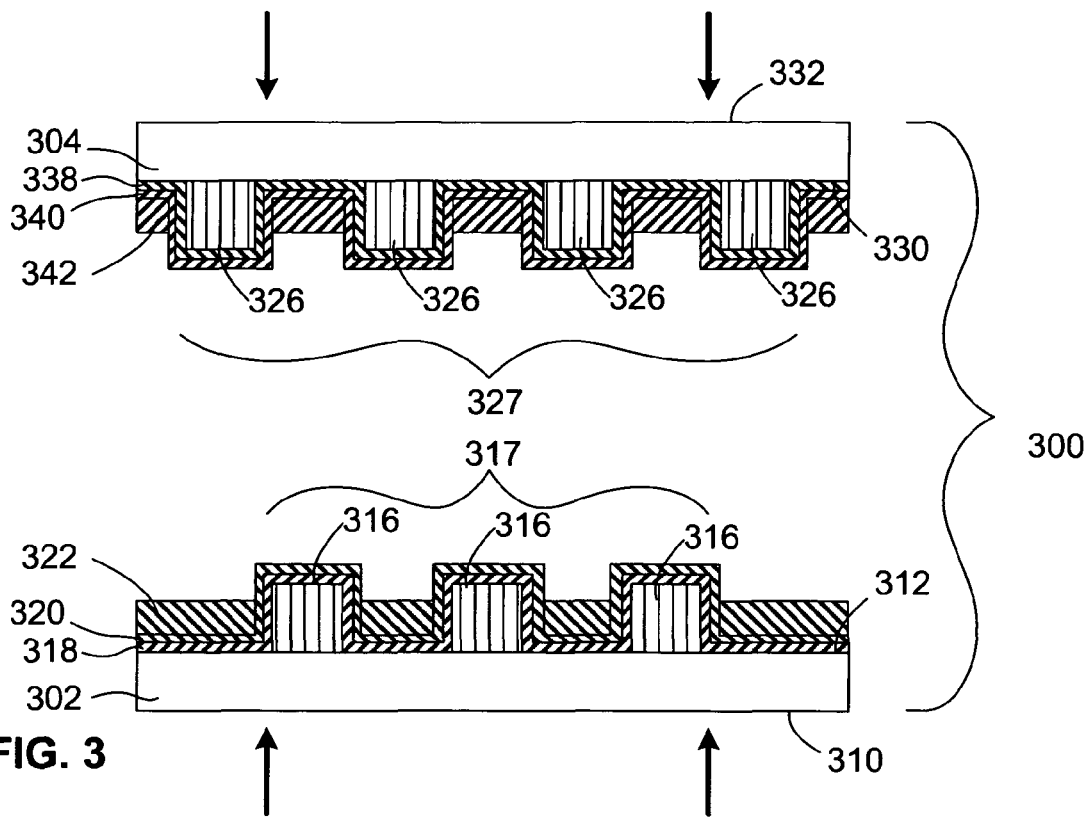
FIG. 3 is a cross-section elevation of two substrates that are being mated with CNT arrays and metal TIMs according to an embodiment.

FIG. 3 is a cross-section elevation of two substrates that are being mated with CNT arrays and metal TIMs according to an embodiment.

A first substrate 302 is depicted with a CNT first array 317, depicted as three CNT array clusters 316 disposed on a backside surface 312 of the substrate 302. In an embodiment, the first substrate 302 represents a semiconductive material such as that of a microelectronic die. Accordingly, the first substrate 302 includes an active surface 310 and a backside surface 312. In an embodiment, the first substrate as a microelectronic die 302 includes backside metallization (BSM) such as a titanium layer against the semiconductive material, as well as optional other layers disposed above the BSM first layer. Such BSM layers, if present, are well understood and are not illustrated.

The first substrate 302 has been overcoated with a metallization first film 318. Accordingly, the CNT array 317 and the first substrate 302 are in contact with the metallization first film 318. In an embodiment, the metallization first film 318 is a metal such as titanium or a titanium alloy. In an embodiment, the metallization first film 318 is a metal such as chromium or a chromium alloy. In an embodiment, the metallization first film 318 is a metal or substance that adheres to the substrate 302 and to the CNT array 317. A metallization second film 320 is formed according to an embodiment. In an embodiment where the metallization first film 318 is a metal such as titanium, the metallization second film 320 is a flash layer of gold. The metallization first film 318 and the metallization second film 320 are enhanced in size for clarity.

A second substrate 304 is depicted with a CNT second array 327, depicted as four CNT array clusters 326 disposed on a die-side surface 330 of the substrate 304. In an embodiment, the second substrate 304 represents a heat-sink material such as that of an IHS. Accordingly, the second substrate 304 includes a die-side surface 330 and a backside surface 332. In an embodiment, the second substrate as an IHS 304 includes a cladding such as a nickel layer against a copper material that is the bulk of the IHS 304. A cladding layer, if present, is well understood and is not illustrated.

The second substrate 304 has been "undercoated" with a metallization first film 338. Accordingly, the CNT second array 327 and the second substrate 304 are in contact with the metallization first film 338. In an embodiment, the metallization first film 338 is a metal such as titanium or a titanium alloy. In an embodiment, the metallization first film 338 is a metal such as chromium or a chromium alloy. In an embodiment, the metallization first film 338 is a metal or substance that adheres to the second substrate 304 and to the CNT second array 327. A metallization second film 340 is formed according to an embodiment. In an embodiment where the metallization first film 338 is a metal such as titanium, the metallization second film 340 is a flash layer of gold. The metallization first film 338 and the metallization second film 340 are enhanced in size for clarity.

As illustrated, the CNT first array 317, depicted as three CNT array clusters 316, and the CNT second array 327, depicted as four CNT array clusters 326, exhibit a complementary geometry during the substrate-mating process as indicated by the directional arrows. Consequently the CNT first array 317 intermingles without significant vertical contact, if at all, with the CNT second array 327 in a geometrically complementary configuration.

In an embodiment, a TIM metal third film 322 has impregnated only the CNT first array 317 and the three CNT array clusters 316. Further as illustrated, the TIM metal third film 322 is adhered to the first substrate 302 by way of the metallization first film 318 and the metallization second film 320. In an embodiment, sufficient metal in the form of the TIM metal third film 322 is present such that during the substrate-mating process of the first substrate 302 to the second substrate 304, the TIM metal third film 322 flows to impregnate both the CNT first array 317 and the CNT second array 327.

In an embodiment, a TIM metal third film 342 is present, adhered to, and impregnated within the CNT second array 327. During the substrate-mating process of this embodiment, the amounts of the TIM metal third film 322 and the TIM metal third film 342 are adjusted to allow for alloyed bonding, or for co-equivalent metal bonding without significant spillage if any.

In an embodiment, the process of impregnating a CNT array for a TIM can be done before assembly of a single substrate with a second substrate. In an embodiment, the process of impregnating a CNT array for a TIM can be done after assembly of a single substrate with a second substrate.

Figure 4:
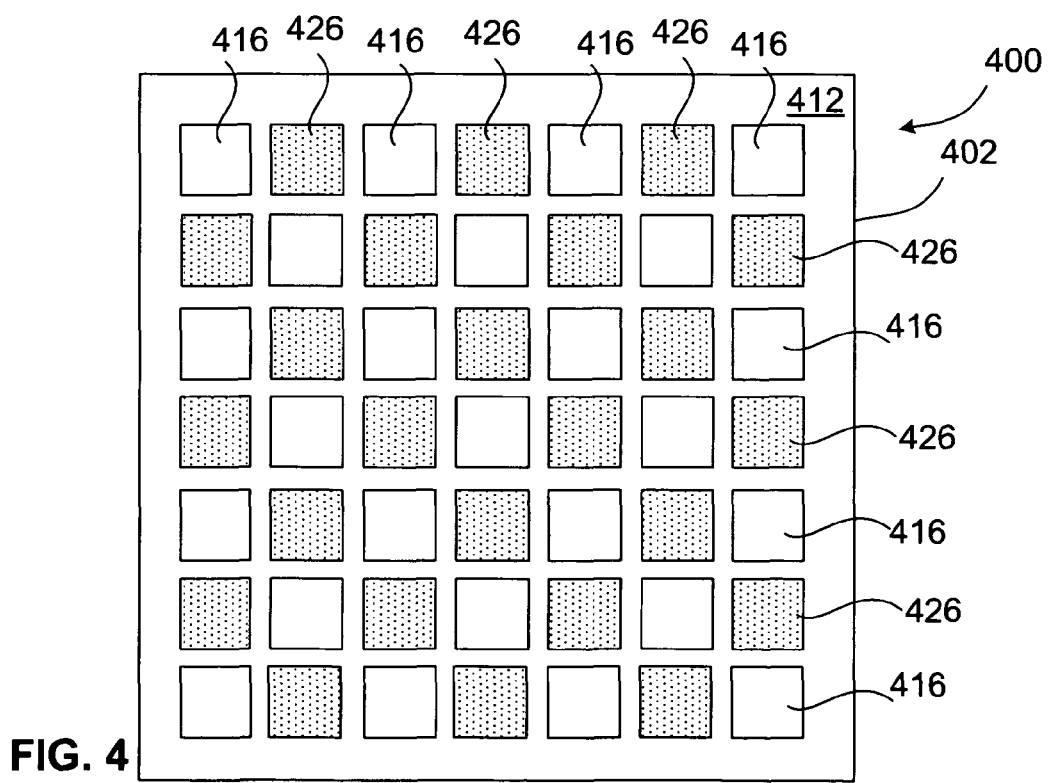
FIG. 4 is a top cut-away plan of two CNT arrays that are geometrically complementary according to an embodiment.

FIG. 4 is a top cut-away plan of two CNT arrays 400 that are geometrically complementary according to an embodiment. A CNT first array is depicted as CNT first clusters 416, which are patterned in a four-by-four spaced configuration. The CNT first array is disposed upon a first substrate 402 such as upon the backside surface 412 of an IC chip processor. A CNT second array is depicted as CNT second 426 clusters, which are patterned in a three-by-three spaced configuration that is geometrically complementary to the CNT first array. The CNT second array would be anchored to a second substrate that is removed for clarity.

Figure 5:
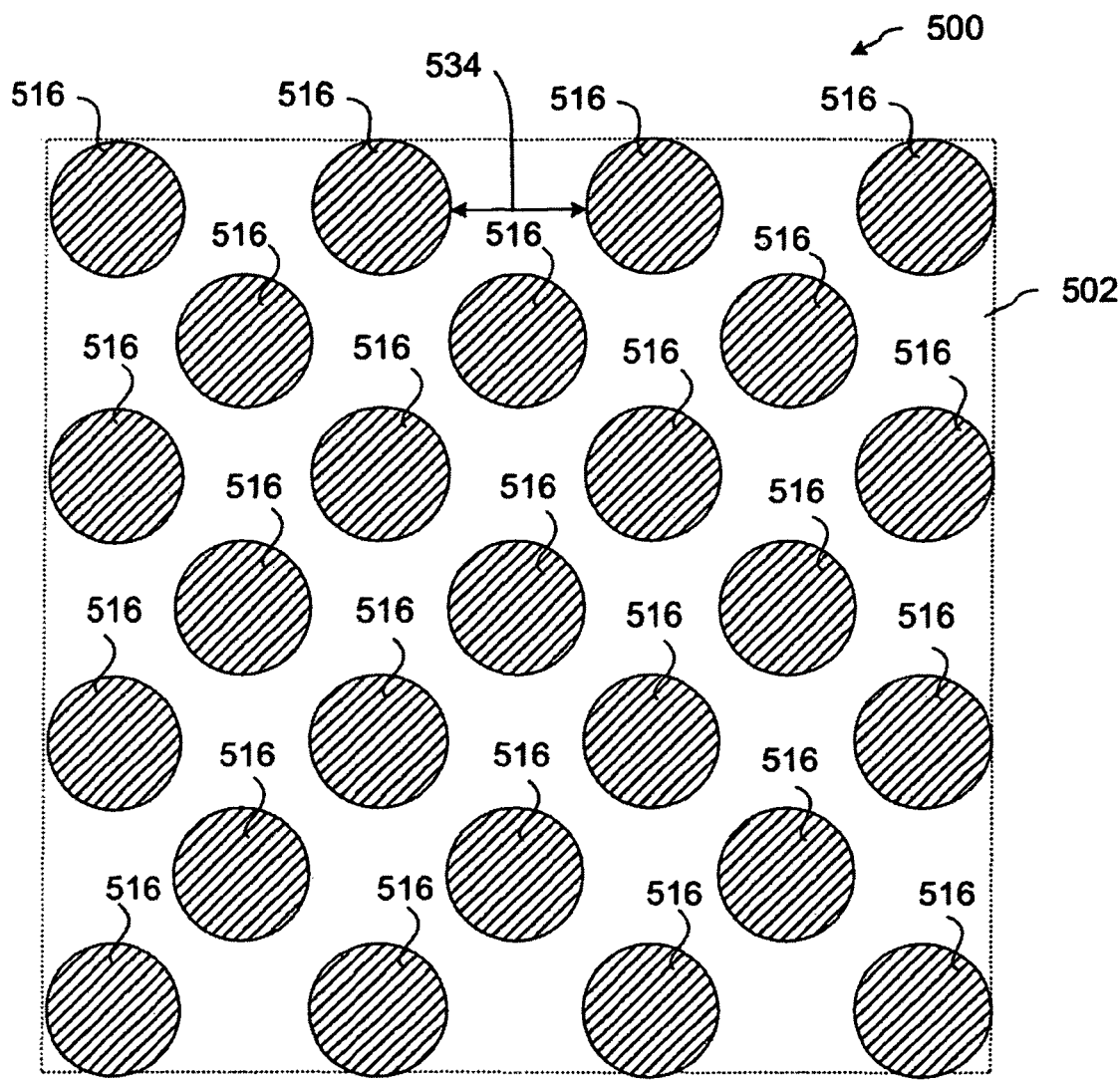
FIG. 5 is a cross-section top plan of a CNT array according to various embodiments.

FIG. 5 is a cross-section top plan of a CNT array 500 according to various embodiments. The CNT array 500 includes a substrate 502 and a CNT array that is laid out in circular CNT clusters 516 that can be stand-alone CNT clusters for a heat sink enabling solution according to an embodiment. In FIG. 5, all of the CNT clusters 516 are enumerated. In this embodiment, the CNT clusters 516 are spaced apart so as to provide a complementary geometry for a second CNT array that can fit into the interstices, one of which is denominated with reference numeral 534.

In an embodiment, the illustrated structure 500 includes the substrate 502, but the structures enumerated as items 516 represent individual carbon nanotubes that have been formed by, e.g., CVD processing. Accordingly, the carbon nanotubes 516 can have a width dimension in a range from about 15 nm to about 25 nm.

Figure 6:
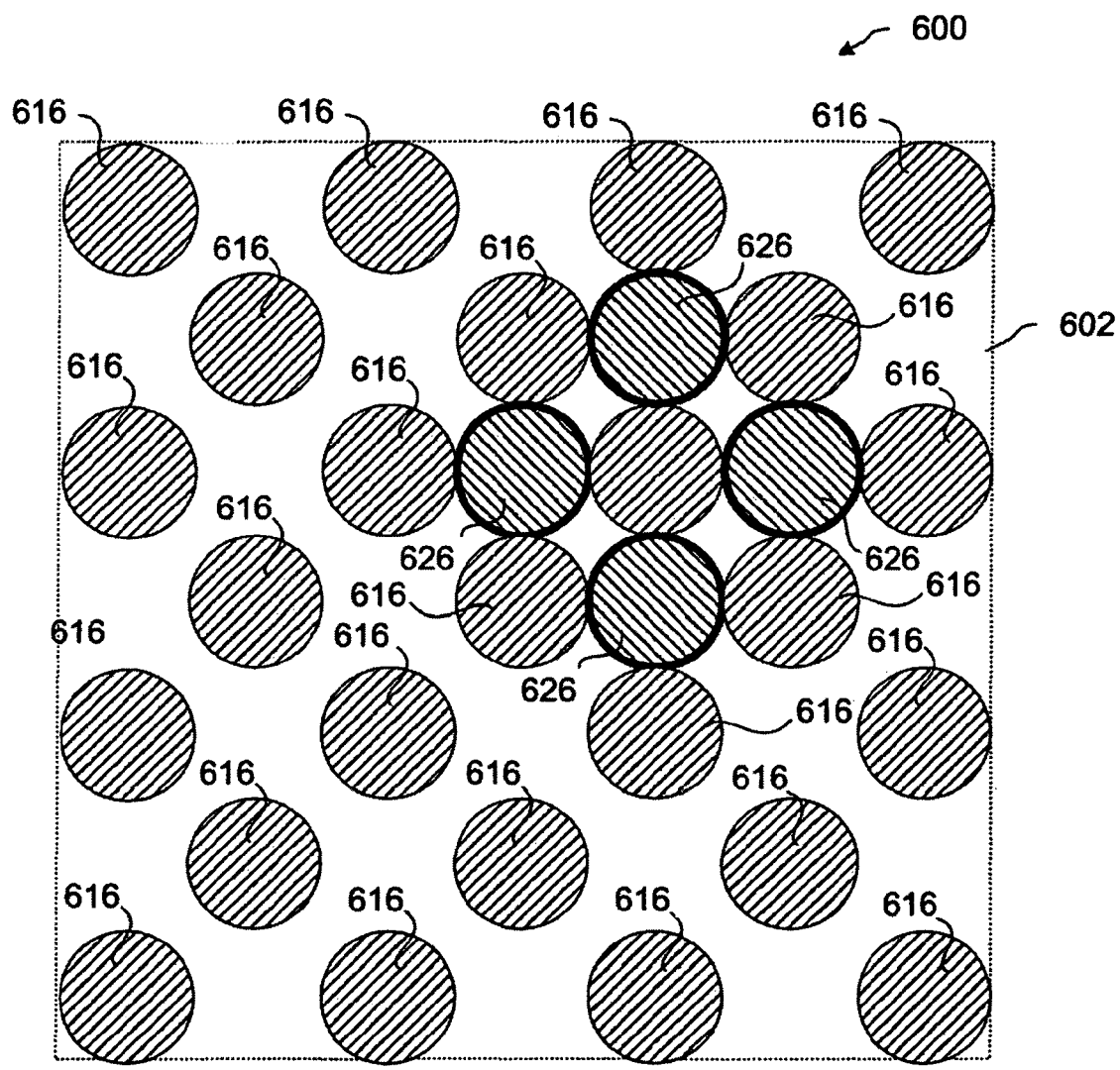
FIG. 6 is a cross-section top plan of a CNT array according to various embodiments.

FIG. 6 is a cross-section top plan of a CNT array 600 according to various embodiments. The CNT array 600 includes a substrate 602 and a CNT first array that is laid out in circular CNT first clusters 616 that can be stand-alone CNT clusters for a heat sink enabling solution according to an embodiment. In FIG. 6, a CNT second array is laid out in a complementary geometry and is designated as circular CNT second clusters, which are designated with the reference numeral 626. As illustrated, the CNT second array clusters 626 fit into four interstices of the CNT first array clusters 616. In this embodiment, the CNT second array clusters 626 are configured to be positioned over a location of exceptional heat such as a hot spot on a processor. Accordingly, excessive heat generation at the hot spot can be addressed by the second array clusters 626 and the first array clusters 616 that are contiguous to the second array clusters 626. The configuration in FIG. 6 can be described therefore as including a higher CNT concentration on a first area of the substrate 602, including the second array clusters 626 and the first array clusters 616 that are contiguous to the second array clusters 626, than any other array area on the substrate 602.

In an embodiment, the illustrated structure 600 includes the substrate 602, but the structures enumerated as items 616 and 626 represent individual carbon nanotubes that have been formed by, e.g., CVD processing.

Figure 7:
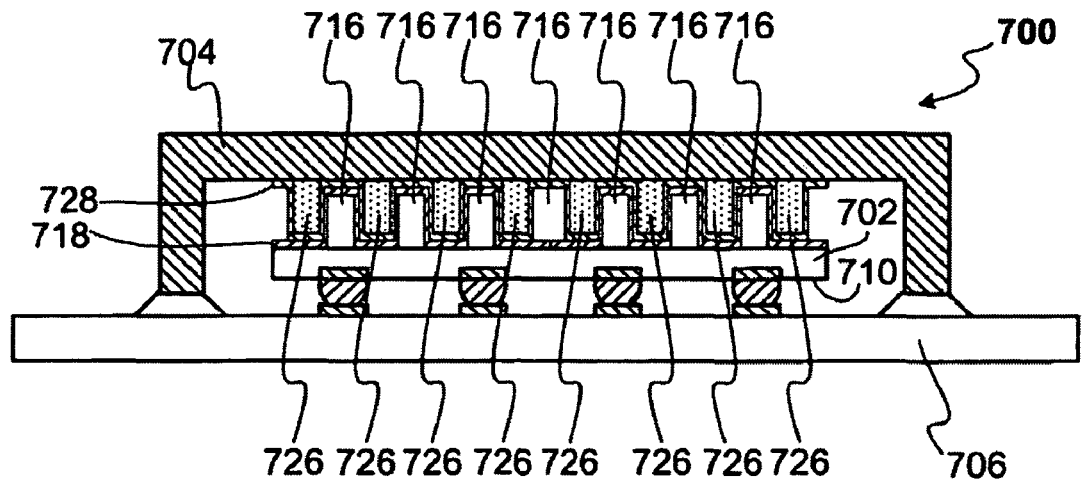
FIG. 7 is a cross-section elevation of a package that includes a CNT array with metal in a TIM according to an embodiment.

FIG. 7 is a cross-section elevation of a package 700 that includes a CNT array with metal in a TIM according to an embodiment. In an embodiment, a first substrate 702 is represented as an IC die with an active surface 710. The IC die 702, as the first substrate 702, is flip-chip disposed between an IHS second substrate 704 and a mounting substrate 706. The package 700 also includes a metallization first film 718 that is adhered to a CNT first array, depicted as clusters of a first CNT 716. The package also includes a metallization second film 728 that is adhered to a CNT second array, depicted as clusters of a second CNT 726. The respective CNT first clusters 716 and second clusters 726 are aligned such that the thermal conductivity through the combined CNT arrays is in a range from about 500 W/m-K to about 3,000 W/m-K. In an embodiment, the thermal conductivity of the CNT array is in a range from about 1,000 W/m-K to about 2,000 W/m-K. In contrast with a polymer-solder hybrid TIM, the CNT array TIM has a thermal conductivity that is in a range from about 1 W/m-K to about 5 W/m-K.

The mounting substrate 706 can be any mounting substrate known in the art, such as a printed circuit board (PCB), a main board, a motherboard, a mezzanine board, an expansion card, or another mounting substrate.

Figure 8:
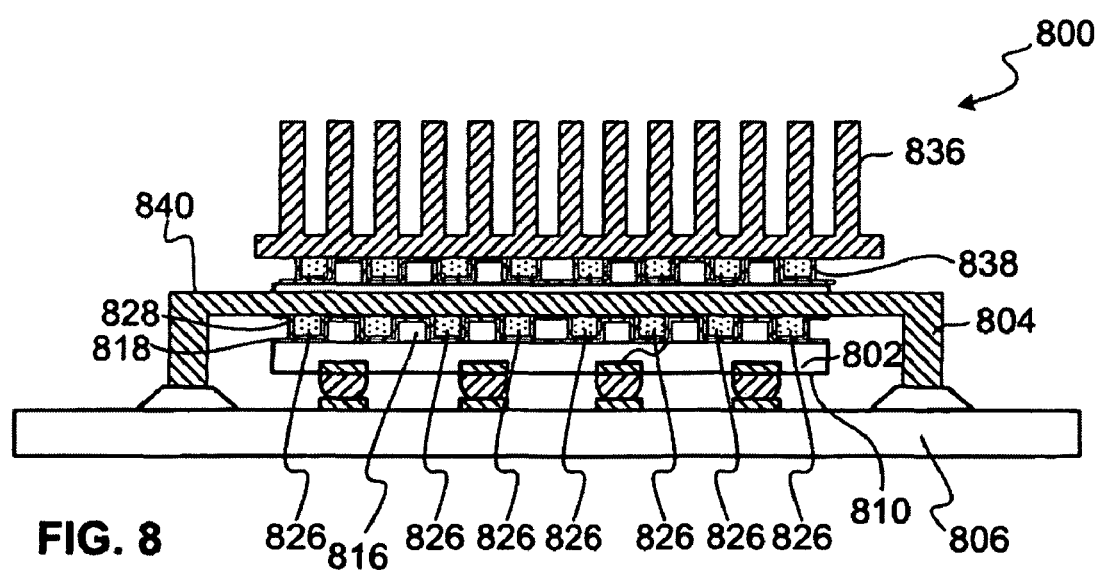
FIG. 8 is a cross-section elevation of a package that includes a CNT array with metal in a TIM according to an embodiment.

FIG. 8 is a cross-section elevation of a package 800 that includes a CNT array with metal in a TIM according to an embodiment. In an embodiment, a first substrate 802 is represented as a die with an active surface 810. The die 802, as the first substrate 802, is flip-chip disposed between an IHS second substrate 804 and a mounting substrate 806. The package 800 also includes a first metallization 818 that is adhered to a CNT first array, depicted as clusters of a first CNT 816. The package 800 also includes a second metallization 828 that is adhered to a CNT second array, depicted as clusters of a second CNT 826. In an embodiment, the respective CNT first clusters 816 and second clusters 826 are part of what is referred to as a first-level TIM or a TIM1.

The respective CNT first clusters 816 and second clusters 826 are aligned such that the thermal conductivity through the combined CNT arrays is in a range from about 500 W/m-K to about 3,000 W/m-K. In an embodiment, the thermal conductivity of the CNT array is in a range from about 1,000 W/m-K to about 2,000 W/m-K.

The package 800 also includes a heat sink 836 such as a vaned heat sink that is positioned over an IHS 804 that is the second substrate 804. As illustrated according to an embodiment, a CNT upper array 838 is disposed upon the second substrate 804, heat-sink side 840. In an embodiment, the CNT upper array 838 can likewise be first clusters and second clusters similar to the respective CNT first clusters 816 and second clusters 826 of the TIM1. Consequently the CNT upper array 838 is part of what is referred to as a second-level TIM or a TIM2.

Figure 9:
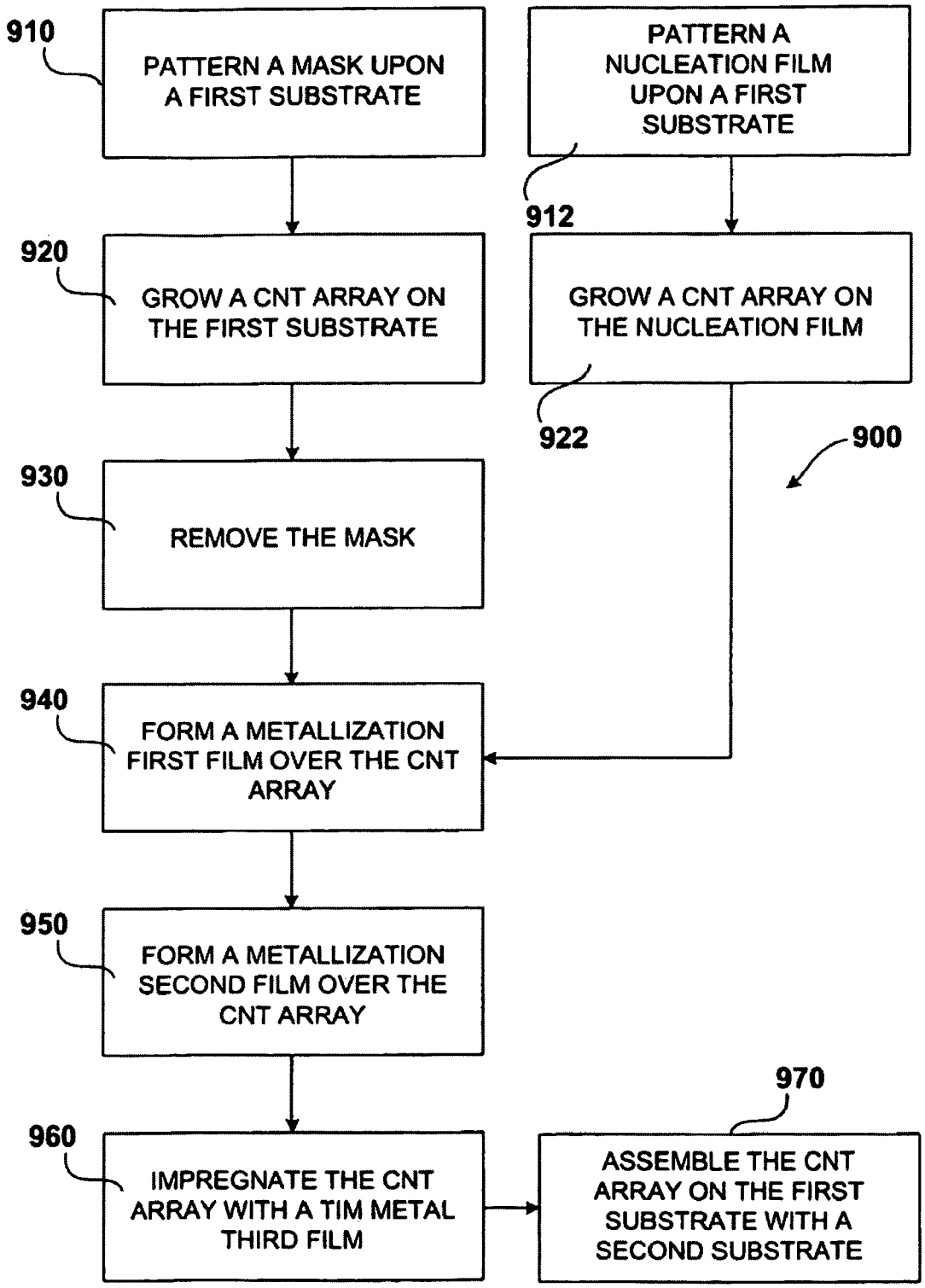
FIG. 9 is a flow chart that describes process and method flow embodiments.

FIG. 9 is a flow chart 900 that describes process and method flow embodiments.

At 910, the process includes patterning a mask upon a first substrate. By way of non-limiting example, the mask 114 is patterned upon an IC die first substrate 101 as depicted in FIG. 1B.

At 912, the process includes patterning a nucleation film upon a first substrate. By way of non-limiting example, the nucleation film 224 is patterned upon an IC die first substrate 201 as depicted in FIG. 2B.

At 922, the process includes growing a CNT array on the nucleation film. By way of non-limiting example, the CNT bundles 216 in FIG. 2C are grown upon the nucleation film 224 in a first pattern that is dictated by the presence of the nucleation film 224. In an embodiment, the process commences at 912 and terminates at 940.

At 920, the process includes growing a CNT array on the first substrate in a first pattern. By way of non-limiting example, the CNT bundles 116 in FIG. 1C are grown upon the substrate backside surface 112 in a first pattern that is dictated by the presence of the mask 114. By way of non-limiting example, the CNT bundles 216 in FIG. 2C are grown upon the substrate backside surface 212 in a first pattern that is dictated by the presence of the patterned nucleation film 224. In an embodiment, the process commences at 910 and terminates at 920.

At 930, the process includes removing the mask.

At 940, the process includes forming a metallization first film over the CNT array. In an embodiment, the process commences at 912 and terminates at 920. By way of non-limiting example, the metallization first film 118 is CVD deposited titanium that forms over the CNT first array 117. By way of non-limiting example, the metallization first film 118 is PVD deposited titanium that forms over the CNT first array 117. In an embodiment, the process commences at 910 or at 912 and terminates at 940.

At 950, the process includes forming a metallization second film over the CNT array. By way of non-limiting example, the metallization second film 120 is electroless plated gold that forms over the metallization first film 118. In an embodiment, the process commences at 910 or at 912 and terminates at 950.

At 960, the process includes impregnating the CNT array with a metal third film. By way of non-limiting example, the metal third film 122 is reflowed indium metal. In an embodiment, the process commences at 910 or at 912 and terminates at 960.

At 970, a method includes assembling the CNT first array of the first substrate with a second substrate. By way of non-limiting example, the first substrate 302 is assembled to the second substrate 304.

Figure 10:
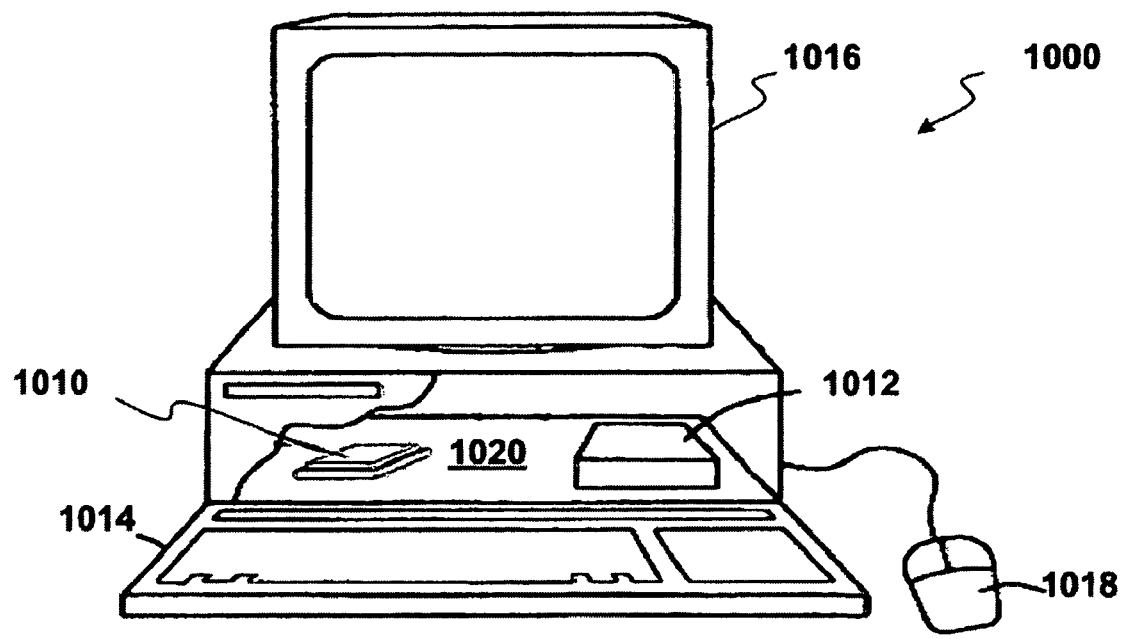
FIG. 10 is a cut-away elevation that depicts a computing system according to an embodiment.

FIG. 10 is a cut-away elevation that depicts a computing system 1000 according to an embodiment. One or more of the foregoing embodiments of the CNT array TIM may be utilized in a computing system, such as a computing system 1000 of FIG. 10. Hereinafter any CNT array TIM embodiments alone or in combination with any other embodiment is referred to as an embodiment(s) configuration.

The computing system 1000 includes at least one processor (not pictured), which is enclosed in a package 1010, a data storage system 1012 such as dynamic random-access memory, at least one input device such as a keyboard 1014, and at least one output device such as a monitor 1016, for example. The computing system 1000 includes a processor that processes data signals, and may include, for example, a microprocessor, available from Intel Corporation. In addition to the keyboard 1014, the computing system 1000 can include another user input device such as a mouse 1018, for example.

For purposes of this disclosure, a computing system 1000 embodying components in accordance with the claimed subject matter may include any system that utilizes a microelectronic device system, which may include, for example, at least one of the CNT array TIM embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1012.

In an embodiment, the computing system 1000 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 1020. In this embodiment, an embodiment(s) configuration is coupled to the DSP, and a separate embodiment(s) configuration may be present that is coupled to the processor in the package 1010. Additionally in an embodiment, an embodiment(s) configuration is coupled to a DSP that is mounted on the same board 1020 as the package 1010. It can now be appreciated that the embodiment(s) configuration can be combined as set forth with respect to the computing system 1000, in combination with an embodiment(s) configuration as set forth by the various embodiments of the CNT array TIM within this disclosure and their equivalents.

Figure 11:
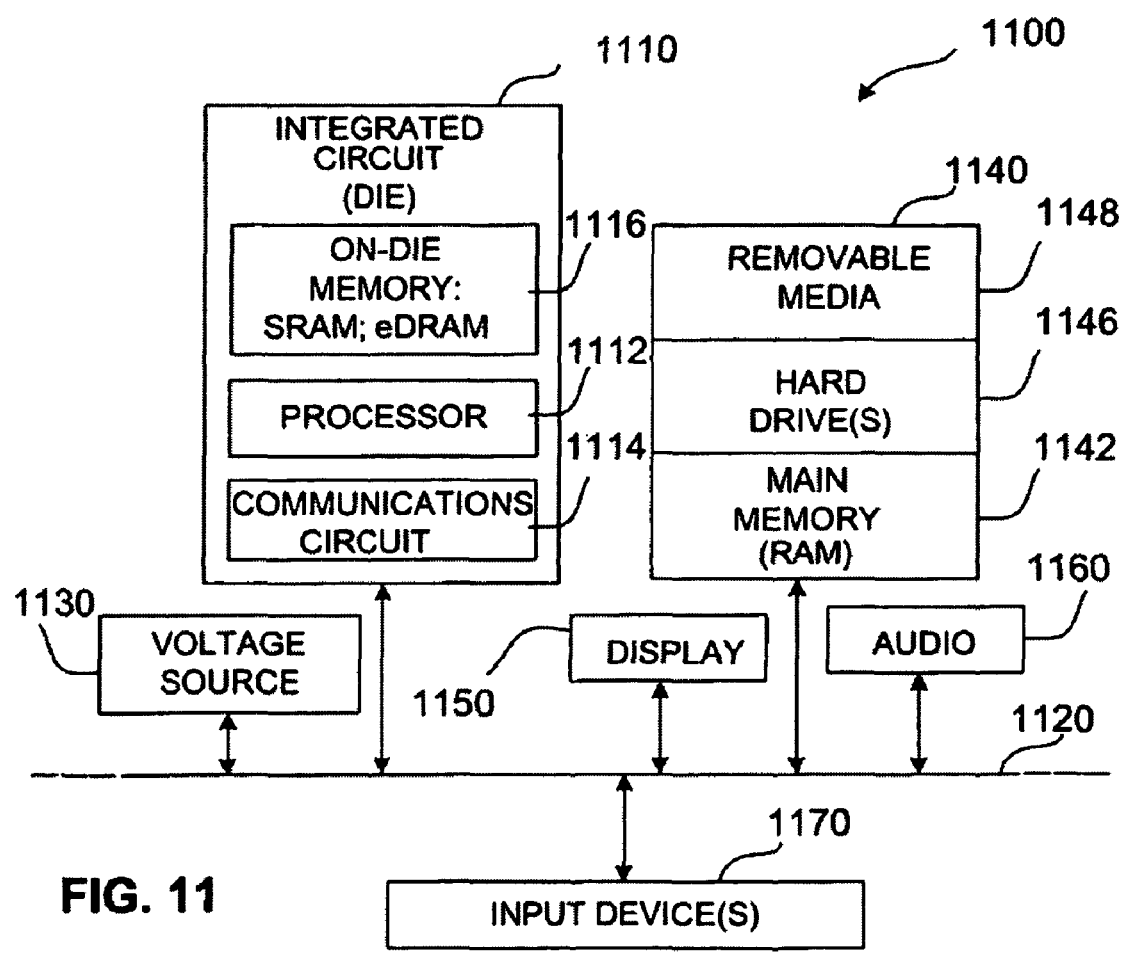
FIG. 11 is a schematic of a computing system according to an embodiment.

FIG. 11 is a schematic of a computing system according to an embodiment. The electronic system 1100 as depicted can embody the computing system 1000 depicted in FIG. 10, but the electronic system is depicted more generically. The electronic system 1100 incorporates at least one electronic assembly 1110, such as an IC package illustrated in FIGS. 7 and 8. In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 means any type of circuit such as, but not limited to, a microprocessor, a microcontroller, a graphics processor, a digital signal processor, or another processor. Other types of circuits that can be included in the integrated circuit 1110 are a custom circuit or an ASIC, such as a communications circuit 1114 for use in wireless devices such as cellular telephones, pagers, portable computers, two-way radios, and similar electronic systems. In an embodiment, the processor 1110 includes on-die memory 1116 such as SRAM. In an embodiment, the processor 1110 includes on-die memory 1116 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital video disks (DVDs), flash memory keys, and other removable media known in the art.

In an embodiment, the electronic system 1100 also includes a display device 1150, an audio output 1160. In an embodiment, the electronic system 1100 includes a controller 1170, such as a keyboard, mouse, trackball, game controller, microphone, voice-recognition device, or any other device that inputs information into the electronic system 1100.

As shown herein, integrated circuit 1110 can be implemented in a number of different embodiments, including an electronic package, an electronic system, a computer system, one or more methods of fabricating an integrated circuit, and one or more methods of fabricating an electronic assembly that includes the integrated circuit and the CNT array TIM as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   growing a first carbon nanotube (CNT) array on a first substrate in a first pattern;
   growing a second CNT array on a second substrate in a second pattern that is geometrically complementary to the first pattern; and
   assembling the first CNT array and the second CNT array such that the first substrate and the second substrate are joined at the first CNT array and the second CNT array.

2. The process of claim 1, further including impregnating the first CNT array with a metal, wherein impregnating is selected from impregnating before assembling and impregnating after assembling.

3. The process of claim 1, wherein the first substrate is a microelectronic die backside, and wherein the second substrate is a heat sink, and wherein growing at least one of the first CNT array and the second CNT array is carried out by CVD depositing carbon onto the at least one of the first substrate and the second substrate.

4. The process of claim 1, wherein the first substrate is a heat spreader, and wherein the second substrate is a heat sink, and wherein growing at least one of the first CNT array and the second CNT array is carried out by CVD depositing carbon onto the at least one of the first substrate and the second substrate.

5. The process of claim 1, wherein growing the first CNT array is carried out by first pre-patterning the first CNT array, and second growing the first CNT array, wherein first pre-patterning is carried out by pre-patterning a CNT-deposition catalyst on the substrate.

6. A process comprising:
   growing a first carbon nanotube (CNT) array on a first substrate in a first pattern;
   growing a second CNT array on a second substrate in a second pattern that is geometrically complementary to the first pattern;
   assembling the first CNT array and the second CNT array such that the first substrate and the second substrate are joined at the first CNT array and the second CNT array;
   impregnating the first CNT array with a metal, wherein impregnating is selected from impregnating before assembling and impregnating after assembling; and
   wherein growing the first CNT array is carried out by first pre-patterning the first CNT array, and second growing the first CNT array, and wherein first pre-patterning is carried out by pre-patterning a CNT-deposition catalyst on the substrate.

7. The process of claim 6, wherein the first substrate is a microelectronic die backside, and wherein the second substrate is a heat sink, and wherein growing at least one of the first CNT array and the second CNT array is carried out by CVD depositing carbon onto the at least one of the first substrate and the second substrate.

8. The process of claim 6, wherein the first substrate is a heat spreader, and wherein the second substrate is a heat sink, and wherein growing at least one of the first CNT array and the second CNT array is carried out by CVD depositing carbon onto the at least one of the first substrate and the second substrate.

* * * * *